(12) United States Patent
Koui et al.

(10) Patent No.: US 12,133,472 B2
(45) Date of Patent: Oct. 29, 2024

(54) MAGNETIC STORAGE DEVICE

(71) Applicant: KIOXIA CORPORATION, Tokyo (JP)

(72) Inventors: Katsuhiko Koui, Yokohama Kanagawa (JP); Masaru Toko, Tokyo (JP); Soichi Oikawa, Tokyo (JP); Hideyuki Sugiyama, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 333 days.

(21) Appl. No.: 17/463,522

(22) Filed: Aug. 31, 2021

(65) Prior Publication Data

US 2022/0302371 A1 Sep. 22, 2022

(30) Foreign Application Priority Data

Mar. 19, 2021 (JP) ................. 2021-045389

(51) Int. Cl.
*H10N 50/80* (2023.01)
*H01F 10/32* (2006.01)
*H10B 61/00* (2023.01)
*H10N 50/10* (2023.01)
*H10N 50/85* (2023.01)

(52) U.S. Cl.
CPC ......... *H10N 50/80* (2023.02); *H01F 10/3259* (2013.01); *H01F 10/3272* (2013.01); *H01F 10/3286* (2013.01); *H10B 61/00* (2023.02); *H10N 50/10* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 7,525,776 B2* | 4/2009 | Fukuzawa | G11B 5/3903 360/324.11 |
| 8,064,244 B2 | 11/2011 | Zhang et al. | |
| 8,649,127 B2 | 2/2014 | Fuji et al. | |
| 8,760,154 B2 | 6/2014 | Giddings et al. | |

(Continued)

FOREIGN PATENT DOCUMENTS

| | | |
|---|---|---|
| JP | 2008-085219 A | 4/2008 |
| JP | 5235964 B2 | 7/2013 |

(Continued)

OTHER PUBLICATIONS

Fukuzawa et al. "NOL specular spin-valve heads using an ultrathin CoFe free layer" Journal of Magnetism and Magnetic Materials, vol. 235, 2001, pp. 208-212.

*Primary Examiner* — Kevin M Bernatz
(74) *Attorney, Agent, or Firm* — Kim & Stewart LLP

(57) ABSTRACT

A magnetic storage device includes a magnetoresistance effect element including a first magnetic layer having a variable magnetization direction, a second magnetic layer having a fixed magnetization direction, and a non-magnetic layer between the first and second magnetic layers. The first magnetic layer includes a first layer that is magnetic, a second layer that is magnetic and farther from the non-magnetic layer than the first layer, and a third layer between the first and second layers. The third layer includes a first portion formed of an insulating material or a semiconductor material and a plurality of second portions surrounded by the first portion and formed of a conductive material.

20 Claims, 3 Drawing Sheets

(56) References Cited

U.S. PATENT DOCUMENTS

| | | | | |
|---|---|---|---|---|
| 9,236,560 B1* | 1/2016 | Li | ................ | H10N 50/80 |
| 10,566,042 B2* | 2/2020 | Machida | ................ | G11B 5/39 |
| 10,636,964 B2* | 4/2020 | Xue | ................ | G11C 11/16 |
| 2007/0228501 A1* | 10/2007 | Nakamura | ................ | H10B 61/22 |
| | | | | 257/E27.005 |
| 2008/0062578 A1* | 3/2008 | Watanabe | ................ | G11C 11/16 |
| | | | | 360/324.1 |
| 2008/0239591 A1* | 10/2008 | Fuji | ................ | G01R 33/093 |
| | | | | 360/324.12 |
| 2012/0241884 A1* | 9/2012 | Aikawa | ................ | H10N 50/10 |
| | | | | 257/E29.323 |
| 2013/0175644 A1* | 7/2013 | Horng | ................ | B82Y 40/00 |
| | | | | 257/E29.323 |
| 2014/0145792 A1* | 5/2014 | Wang | ................ | H10N 50/10 |
| | | | | 428/828 |
| 2015/0115379 A1* | 4/2015 | Lim | ................ | G01R 33/098 |
| | | | | 257/421 |
| 2017/0279040 A1* | 9/2017 | Tran | ................ | H01F 10/3254 |
| 2018/0277745 A1 | 9/2018 | Oikawa et al. | | |
| 2019/0156875 A1 | 5/2019 | Ohmori et al. | | |
| 2021/0096195 A1* | 4/2021 | Muehlenhoff | ................ | H10N 50/01 |
| 2021/0320245 A1* | 10/2021 | Kalitsov | ................ | H01F 10/329 |
| 2022/0052109 A1* | 2/2022 | Chen | ................ | H01F 41/302 |
| 2022/0238799 A1* | 7/2022 | Guo | ................ | H10N 50/10 |

FOREIGN PATENT DOCUMENTS

| | | |
|---|---|---|
| JP | 5534766 B2 | 7/2014 |
| JP | 5537554 B2 | 7/2014 |
| JP | 5649677 B2 | 1/2015 |
| TW | I654719 B | 3/2019 |

\* cited by examiner

MAGNETIC STORAGE DEVICE

CROSS-REFERENCE TO RELATED APPLICATION

This application is based upon and claims the benefit of priority from Japanese Patent Application No. 2021-045389, filed Mar. 19, 2021, the entire contents of which are incorporated herein by reference.

FIELD

Embodiments described herein relate generally to a magnetic storage device.

BACKGROUND

A magnetic storage device in which a plurality of magnetoresistance effect elements is integrated on a semiconductor substrate has been proposed.

DETAILED DESCRIPTION

Embodiments provide a magnetic storage device including a magnetoresistance effect element having excellent characteristics.

In general, according to one embodiment, a magnetic storage device includes a magnetoresistance effect element including a first magnetic layer having a variable magnetization direction, a second magnetic layer having a fixed magnetization direction, and a non-magnetic layer between the first and second magnetic layers. The first magnetic layer includes a first layer portion that is magnetic, a second layer portion that is magnetic and farther from the non-magnetic layer than the first layer portion, and a third layer portion between the first and second layer portions. The third layer portion includes a first portion formed of an insulating material or a semiconductor material and a plurality of second portions surrounded by the first portion and formed of a conductive material.

Hereinafter, certain example embodiments will be described with reference to the drawings.

Figure 1:
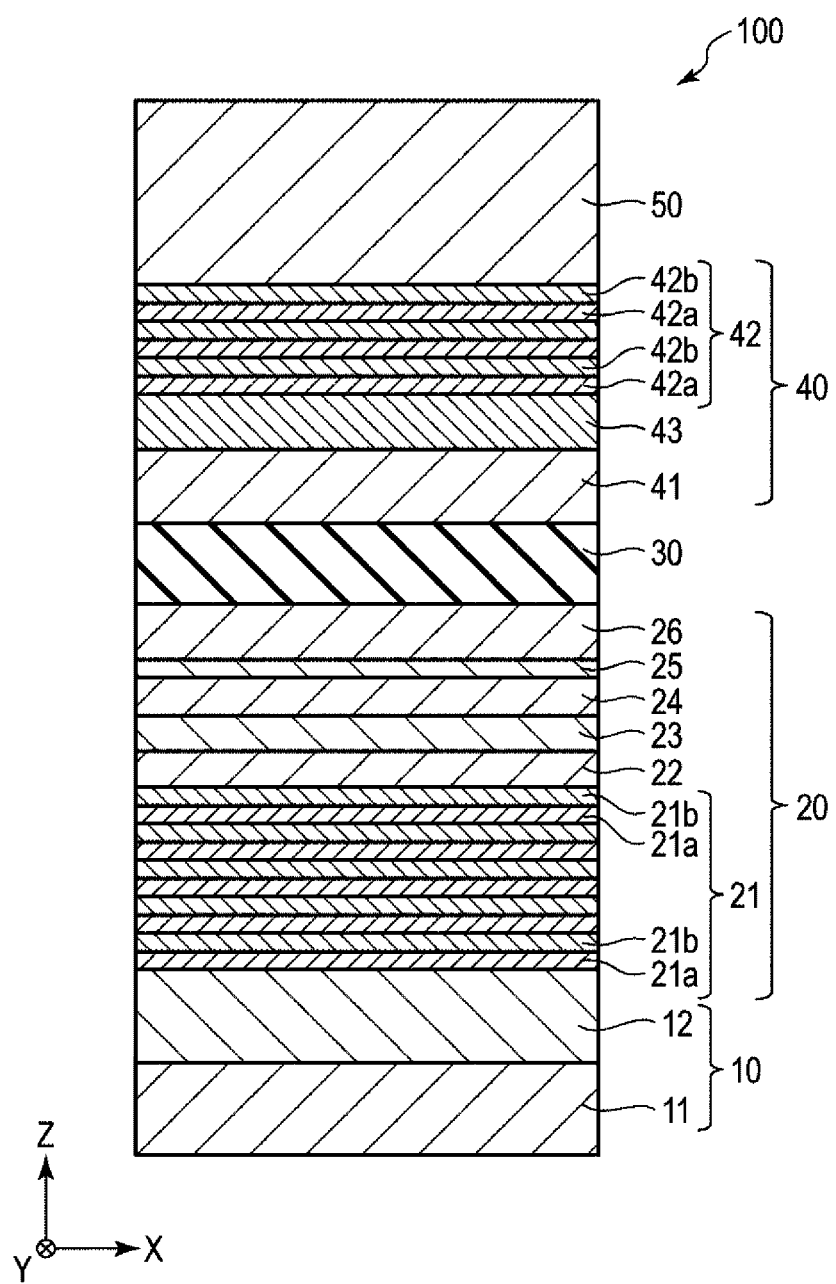
FIG. 1 is a cross-sectional view of a magnetoresistance effect element in a magnetic storage device according to an embodiment.

FIG. 1 is a cross-sectional view in an X-Z plane of a magnetoresistance effect element 100 in a magnetic storage device according to an embodiment.

The magnetoresistance effect element 100 is a magnetic tunnel junction (MTJ) element. The magnetoresistance effect element 100 is a spin transfer torque (STT) element with perpendicular magnetization. The magnetoresistance effect element 100 includes an under layer 10, a reference layer 20, a tunnel barrier layer 30, a storage layer 40, and a cap layer 50.

The under layer 10 is provided for good crystal growth in a magnetic layer (e.g., the reference layer 20 in the example of FIG. 1) formed thereon. Specifically, the under layer 10 includes an amorphous underlayer portion 11 containing tantalum (Ta), molybdenum (Mo), tungsten (W), vanadium (V), niobium (Nb), or the like, and an upper layer portion 12 containing ruthenium (Ru), rhodium (Rh), platinum (Pt), palladium (Pd), osmium (Os), iridium (Ir), aluminum (Al), silver (Ag), or the like. The upper layer portion 12 has a close-packed crystal plane such as a face-centered cubic (FCC) plane or a hexagonal close-packed (HCP) plane. When such an under layer 10 is provided, the reference layer can have a hexagonal close packed structure with excellent perpendicular magnetic anisotropy.

The reference layer 20 is a ferromagnetic layer having a fixed magnetization direction. In this context, a fixed magnetization direction means that the magnetization direction of a layer does not change when a predetermined write current is applied. The reference layer 20 includes: a Co/Pt artificial lattice layer 21 having a cobalt (Co) layer 21a and a platinum (Pt) layer 21b that are alternately stacked, a cobalt (Co) layer 22, a synthetic antiferromagnetic (SAF) bonding layer 23, a cobalt (Co) layer 24, a tantalum (Ta) layer 25, and a CoFeB layer 26 containing cobalt (Co), iron (Fe), and boron (B).

The Co/Pt artificial lattice layer 21 has high perpendicular magnetic anisotropy. In place of the Co/Pt artificial lattice layer 21, a Co/Pd artificial lattice layer, a CoPt alloy layer, a FePt alloy layer, or a Fe—Co—Tb layer may be used.

The SAF bonding layer 23 is formed of an iridium (Ir) layer, a ruthenium (Ru) layer, or a rhodium (Rh) layer. By inclusion of the SAF bonding layer 23, the magnetic stability of the reference layer 20 may be improved, and a leakage magnetic field may be decreased.

On the interfaces of the SAF bonding layer 23, the Co layer 22 and the Co layer 24 that form FCC or HCP planes are provided so that a good SAF bonding force is obtained.

The CoFeB layer 26 is an interface layer. The CoFeB layer 26 is in contact with the tunnel barrier layer 30. Due to the CoFeB layer 26, a good magnetoresistance effect can be obtained.

The Ta layer 25 is in contact with the CoFeB layer 26. When the Ta layer 25 that has a thickness of about 0.5 nm or less is provided, a good interface state can be achieved between the CoFeB layer 26 and the tunnel barrier layer 30. In place of the Ta layer 25, a Mo layer, a Nb layer, or a W layer may be used.

The tunnel barrier layer 30 is an insulating layer provided between the storage layer 40 and the reference layer 20. The tunnel barrier layer 30 is formed of a magnesium oxide (MgO) layer.

The storage layer 40 functions as a ferromagnetic layer having a variable magnetization direction as a whole, and includes an interface layer 41, a high-Ku layer 42, and a functional layer 43. In this context, a variable magnetization direction means that the magnetization direction of the layer can be changed by application of a predetermined write current.

The interface layer 41 is a ferromagnetic layer. The interface layer 41 is provided between the tunnel barrier layer 30 and the high-Ku layer 42, and is in contact with the tunnel barrier layer 30. The interface layer 41 contains at least iron (Fe). In an embodiment, the interface layer 41 is formed of a CoFeB layer containing cobalt (Co), iron (Fe), and boron (B).

The high-Ku layer 42 is ferromagnetic, and has high perpendicular magnetic anisotropy. The perpendicular magnetic anisotropy of the high-Ku Layer 42 is higher than the perpendicular magnetic anisotropy of the interface layer 41. The high-Ku layer 42 contains at least one of iron (Fe) and cobalt (Co), and at least one element selected from platinum (Pt), palladium (Pd), iridium (Ir), ruthenium (Ru), rhodium (Rh), terbium (Tb), or rare earth elements. In an embodiment, the high-Ku layer 42 is formed of a Co/Pt artificial lattice layer having cobalt (Co) layers 42a and platinum (Pt) layers 42b that are alternately stacked. The high-Ku layer 42 may be formed of a Co/Pd artificial lattice layer, a CoPt alloy layer, a FePt alloy layer, or a CoPtCr alloy layer.

Figure 2:
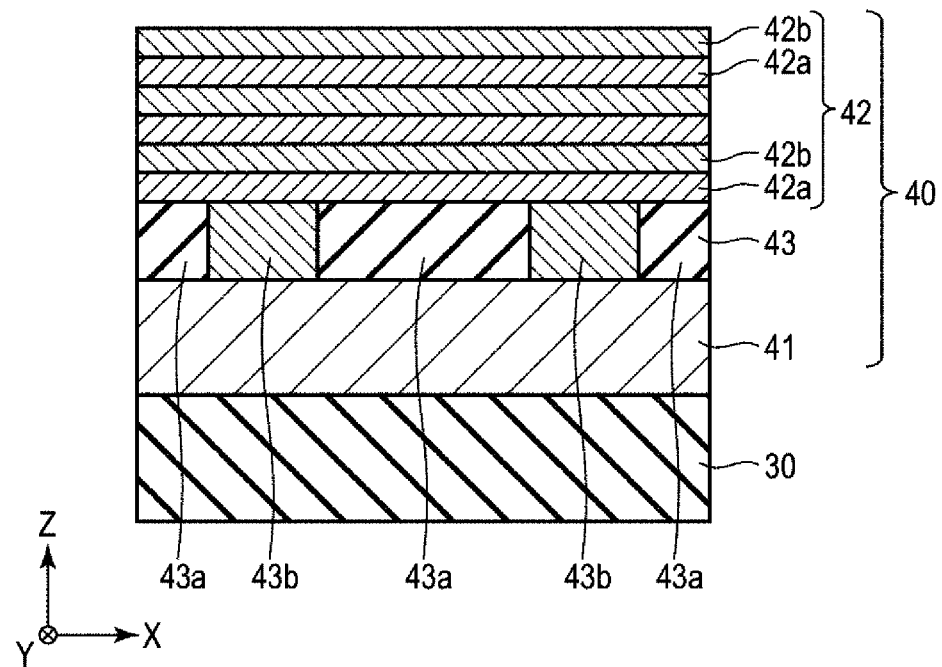
FIG. 2 is a cross-sectional view of a functional layer of a magnetoresistance effect element in a magnetic storage device according to an embodiment.
Figure 3:
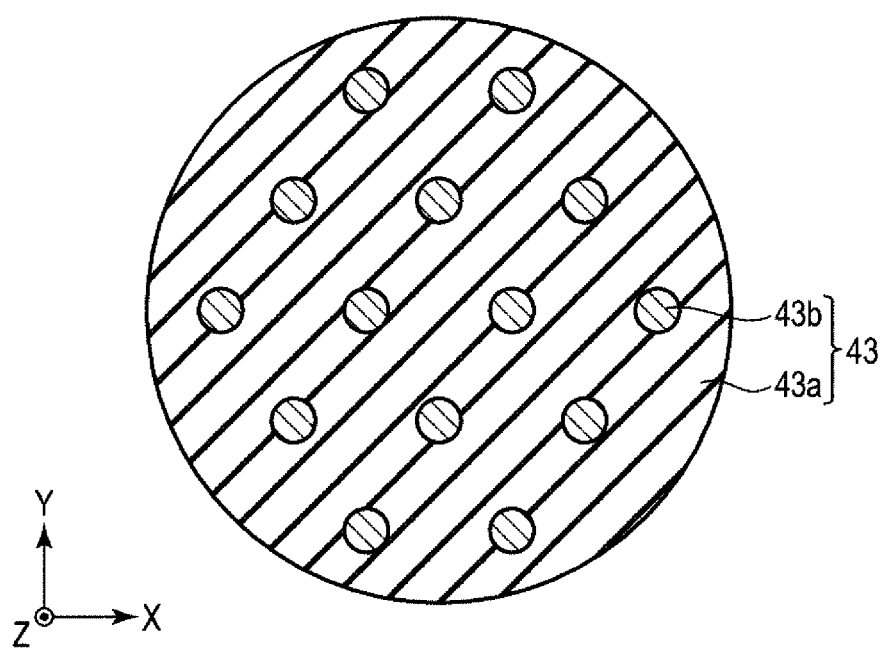
FIG. 3 is a cross-sectional view of a functional layer of a magnetoresistance effect element in a magnetic storage device according to an embodiment.

The functional layer 43 is provided between the interface layer 41 and the high-Ku layer 42. As illustrated in FIGS. 2 and 3, a cross-sectional view in an X-Z plane of the magnetoresistance effect element 100 and a cross-sectional view in an X-Y plane thereof, the functional layer 43 includes a spin diffusion preventing layer 43a that is formed of an insulating material or a semiconductor material, and a plurality of conductive portions 43b that are each surrounded by the spin diffusion preventing layer 43a and are formed of a conductive material. A plurality of the conductive portions 43b penetrate the spin diffusion preventing layer 43a between the interface layer 41a and the high-Ku layer 42. Specifically, a lower surface of each of the conductive portions 43b is in contact with the interface layer 41, and an upper surface of each of the conductive portions 43b is in contact with the high-Ku layer 42.

The functional layer 43 has a function of preventing an increase in damping constant of the interface layer 41 due to spin diffusion from the interface layer 41 to the high-Ku layer 42. The functional layer 43 prevents an increase in write current. It is necessary that the interface layer 41 be magnetically bonded to the high-Ku layer 42 via the functional layer 43. In order to prevent an increase in damping constant and magnetically bond the interface layer 41 to the high-Ku layer 42 as described above, the functional layer 43 includes the spin diffusion preventing layer 43a and the conductive portions 43b.

From the viewpoint of reducing spin diffusion to prevent an increase in damping constant, it is preferable that the ratio of the spin diffusion preventing layer 43a be increased, and that the ratio of the conductive portions 43b that function as a metal path be decreased. On the other hand, when the functional layer 43 is formed of only the spin diffusion preventing layer 43a without the conductive portions 43b, magnetic bonding is not obtained. Therefore, spin torque magnetization reversal affects only the interface layer 41, but does not affect the high-Ku layer 42.

The cap layer 50 is a layer used for improving the characteristics, for example, crystallinity and/or magnetic properties, of the high-Ku layer 42 in contact with the cap layer 50. The cap layer 50 is a non-magnetic conductive layer, and contains, for example, platinum (Pt), tungsten (W), tantalum (Ta), or ruthenium (Ru).

Accordingly, it is necessary that the ratio (hereinafter, sometimes referred to as open area ratio) of the conductive portions 43b to the whole functional layer 43 be precisely adjusted. That is, it is necessary that the ratio of the total area of a plurality of the conductive portions 43b to the area of the functional layer 43 as viewed in the direction (the Z direction) in which the interface layer 41, the high-Ku layer 42, and the functional layer 43 are stacked) be precisely adjusted.

Figure 4:
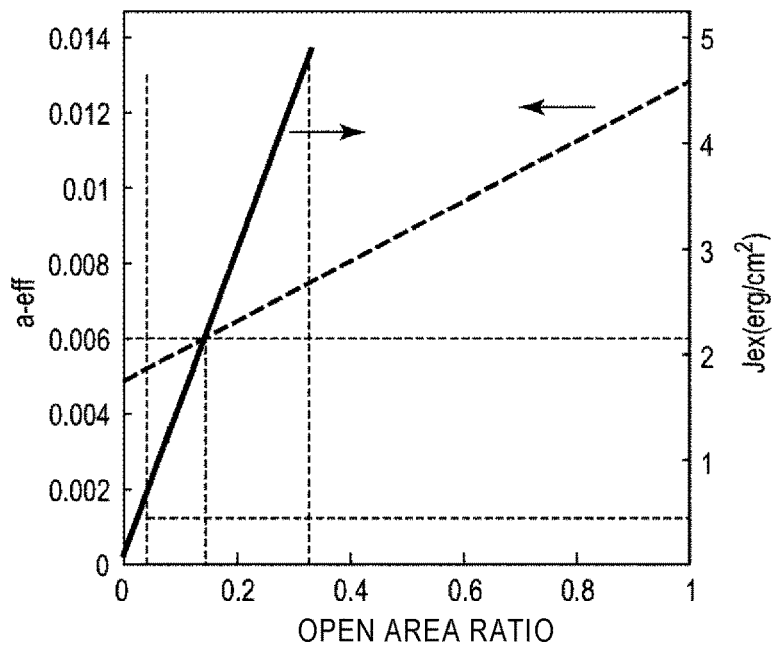
FIG. 4 is a graph illustrating results of a calculation of an appropriate open area ratio in a functional layer of a magnetoresistance effect element in a magnetic storage device according to an embodiment.

FIG. 4 depicts a calculation result of an appropriate open area ratio. A left longitudinal axis a-eff is a value corresponding to a damping constant, and a right longitudinal axis Jex is a value corresponding to the size of magnetic bonding. The thickness of the functional layer 43 is 1 nm.

For good magnetic reversal between the interface layer 41 and the high-Ku layer 42, it is necessary that the value of Jex (erg/cm$^2$) fall within a range of 0.5 to 5. In such a case, it is preferable that the open area ratio fall within a range of about 0.05 to about 0.3. In order to decrease an increase in damping constant to about 10%, it is preferable that the open area ratio be about 0.2 or less. Therefore, it is preferable that the open area ratio (that is, the ratio of the total area of a plurality of the conductive portions 43b to the area of the functional layer 43) fall within a range of 5% to 20%.

The spin diffusion preventing layer 43a has insulating properties, and is formed of an oxide, a nitride, a boride, a II-VI semiconductor, or a III-V semiconductor. The spin diffusion preventing layer 43a needs to have insulating properties to function as a spin diffusion preventing layer. The spin diffusion preventing layer 43a may be formed of an insulating material or a semiconductor material.

The conductive portions 43b are formed of a metal magnetic substance, and function as a metal path. The conductive portions 43b contain at least one element selected from iron (Fe), cobalt (Co), and nickel (Ni).

The conductive portions 43b may further contain at least one element selected from a lanthanide, aluminum (Al), silicon (Si), gallium (Ga), magnesium (Mg), tantalum (Ta), molybdenum (Mo), tungsten (W), calcium (Ca), scandium (Sc), titanium (Ti), vanadium (V), chromium (Cr), manganese (Mn), zinc (Zn), yttrium (Y), zirconium (Zr), niobium (Nb), and hafnium (Hf). Hereinafter, a particular element selected from the above-listed elements may be referred to as a "selected element."

As described above, the conductive portions 43b contain a magnetic metal selected from Fe, Co, and Ni. When the spin diffusion preventing layer 43a is formed of an oxide, it is preferable that an energy of formation of an oxide constituting the spin diffusion preventing layer 43a be lower than an energy of formation of an oxide of the magnetic metal contained in the conductive portion 43b. When the spin diffusion preventing layer 43a is formed of a nitride, it is preferable that an energy of formation of a nitride constituting the spin diffusion preventing layer 43a be lower than an energy of formation of a nitride of the magnetic metal contained in the conductive portion 43b. When the spin diffusion preventing layer 43a is formed of a boride, it is preferable that an energy of formation of a boride constituting the spin diffusion preventing layer 43a be lower than an energy of formation of a boride of the magnetic metal contained in the conductive portion 43b.

When the conditions described above are satisfied, the functional layer 43 can be stably formed. For example, when the spin diffusion preventing layer 43a is an oxide of a selected element, the energy of formation of the oxide of the selected element should be lower than the energy of formation of the oxide of the magnetic metal (e.g., Fe, Co, or Ni). Therefore, when the spin diffusion preventing layer 43a is formed of the oxide of the selected element, the spin diffusion preventing layer 43a that is stable can be formed.

It is preferable that the spin diffusion preventing layer 43a be formed of a material that facilitates epitaxial growth of the high-Ku layer 42 on the spin diffusion preventing layer 43a. Specifically, it is preferable that the spin diffusion preventing layer 43a be formed of an oxide having a spinel structure or an oxide having a corundum structure. More specifically, it is preferable that the spin diffusion preventing layer 43a be formed of a Fe oxide, a Co oxide, or an Al oxide. In particular, when the conductive portions 43b are formed of a Co alloy, a Fe oxide is suitable for the spin diffusion preventing layer 43a.

The thickness of the functional layer 43 is determined depending on the open area ratio of the conductive portions 43b. When the thickness of the functional layer 43 is large, the length of the conductive portions 43b that function as a metal path is long, and the magnetization of the conductive portions 43b is likely to be twisted. As a result, the bonding energy of the interface layer 41 and the high-Ku layer 42 is effectively decreased. In such a case, it is necessary that the open area ratio be increased to increase the damping constant. On the other hand, when the functional layer 43 is thin, a functional layer 43 that has good crystallizability is unlikely to be obtained, and the damping constant is increased. Additionally, the magnetic bonding is unlikely to be adjusted. Thus, it is preferable that the thickness of the functional layer 43 fall within a range of 0.5 nm to 5 nm.

When, in the magnetoresistance effect element 100, the magnetization direction of the storage layer 40 is parallel to the magnetization direction of the reference layer 20, the magnetoresistance effect element 100 is in a low resistance state in which the resistance is relatively low. When the magnetization direction of the storage layer 40 is antiparallel to the magnetization direction of the reference layer 20, the magnetoresistance effect element 100 is in a high resistance state in which the resistance is relatively high. Therefore, in the magnetoresistance effect element 100, binary data can be stored according to the resistance state (that is, one binary value is assigned to the low resistance state and the other is assigned to the high resistance state).

The magnetoresistance effect element 100 illustrated in FIG. 1 has a "top free-type" structure in which the storage layer 40 is positioned on an upper layer side, and the reference layer 20 is positioned on a lower layer side. However, the magnetoresistance effect element 100 may have a "bottom free-type" structure in which the storage layer 40 is positioned on the lower layer side, and the reference layer 20 is positioned on the upper layer side.

Next, an example of a method for forming the functional layer 43 will be described.

On the interface layer 41, an alloy layer of a selected element of the oxide used in the spin diffusion preventing layer 43a and a magnetic metal element constituting the conductive portions 43b is formed. Subsequently, oxygen is introduced into a chamber wherein the alloy layer has been formed, resulting in oxidation, and a heat treatment is further performed. By such a method, the functional layer 43 having a structure in which a plurality of the conductive portions 43b are surrounded by the spin diffusion preventing layer 43a can be formed.

That is, the energy of formation of the oxide of the selected element is less than the energy of formation of the oxide of the magnetic metal element. Therefore, the spin diffusion preventing layer 43a and the conductive portions 43b can be formed by self-assembly.

In the introduction of oxygen into the chamber, use of oxygen plasma or ionized oxygen is effective. In such a case, when energy is supplied to oxygen atoms using a substrate bias or an acceleration grid, stronger oxidation can be achieved. By irradiation with rare gas ions in oxidation, reduction of the conductive portions 43b can be promoted under the oxidation.

Next, another example of the method for forming the functional layer 43 will be described.

On the interface layer 41, a plurality of the conductive portions 43b are formed as islands. For example, a trace amount of oxygen is introduced before formation of the material for the conductive portions 43b, and surface tension is temporarily increased. Thus, conductive portions 43b in an island form can be formed. Subsequently, the spin diffusion preventing layer 43a is formed on the entire surface. Ion milling is then performed to selectively remove only portions of the spin diffusion preventing layer 43a formed on the conductive portions 43b. By such a method, the functional layer 43 having a structure in which a plurality of the conductive portions 43b (islands) are surrounded by the spin diffusion preventing layer 43a can be formed.

As described above, the functional layer 43 comprises the spin diffusion preventing layer 43a and a plurality of the conductive portions 43b that are each surrounded by the spin diffusion preventing layer 43a. According to this configuration, an increase in damping can be prevented with the magnetic bonding between the interface layer 41 and the high-Ku layer 42 maintained. Therefore, a magnetoresistance effect element that has good magnetic characteristics and in which an increase in write current is prevented can be obtained.

When the open area ratio (that is, the ratio of the total area of a plurality of the conductive portions 43b to the area of the functional layer 43) falls within a range of 5% to 20%, the aforementioned effect can be enhanced.

When the thickness of the functional layer 43 falls within a range of 0.5 nm to 5 nm, the aforementioned effect can be enhanced.

Figure 5:
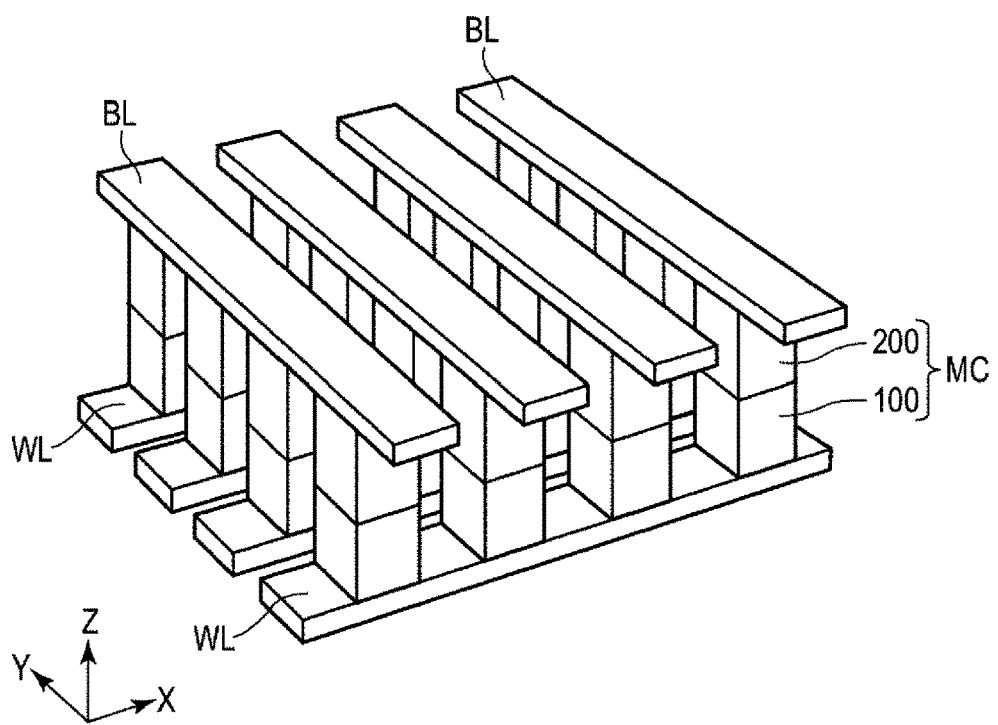
FIG. 5 is a perspective view of a memory cell array unit of a magnetic storage device according to an embodiment.

FIG. 5 is a perspective view of a memory cell array unit of a magnetic storage device in which the magnetoresistance effect element 100 described above is adapted.

The memory cell array unit is provided above a lower portion region (not shown in the drawing) containing a semiconductor substrate (not shown in the drawing), and includes a plurality of word lines WL, a plurality of bit lines BL that intersect the word lines WL, and a plurality of memory cells MC that connect the word lines WL to the bit lines BL.

The word lines WL and the bit lines BL are configured to supply a predetermined signal to the memory cells MC during write or read to the memory cells MC. In FIG. 5, the word lines WL are positioned on the lower layer side, and the bit lines BL are positioned on the upper layer side. However, the word lines WL may be positioned on the upper layer side, and the bit lines BL may be positioned on the lower layer side.

Each of the memory cells MC includes the aforementioned magnetoresistance effect element 100 and a selector 200 that is connected to the magnetoresistance effect element 100 in series.

In FIG. 5, the magnetoresistance effect element 100 is positioned on the lower layer side, and the selector 200 is positioned on the upper layer side. However, the magnetoresistance effect element 100 may be positioned on the upper layer side, and the selector 200 may be positioned on the lower layer side.

The selector 200 is a two-terminal switching element having nonlinear current-voltage characteristics. When a voltage applied to two terminals is less than a threshold value, the selector is in a high resistance state, for example, in an electrically non-conductive state. When the voltage applied to two terminals is equal to or greater than the threshold value, the selector is in a low resistance state, for example, in an electrically conductive state.

When a voltage that is equal to or greater than the predetermined voltage is applied to the word lines WL and the bit lines BL, the selector 200 is in an on state (a conductive state). Thus, write or read to the magnetoresistance effect element 100 connected to the selector 200 in series can be performed.

When the magnetoresistance effect element 100 described above is adapted to the magnetic storage device illustrated in FIG. 5, a magnetic storage device having excellent performance can be obtained.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic storage device, comprising:
a magnetoresistance effect element including:
   a storage layer having a variable magnetization direction,
   a reference layer having a fixed magnetization direction, and
   a tunnel barrier layer between the storage and reference layers in a first direction, wherein
   the storage layer includes:
      a first layer that is magnetic and contacting the tunnel barrier layer,
      a second layer that is magnetic and farther from the tunnel barrier layer than is the first layer in the first direction, and
      a third layer between the first and second layers in the first direction and including a first portion that is an insulating material or a semiconductor material and a plurality of second portions that are conductive material and surrounded in a plane orthogonal to the first direction by the first portion, the plurality of second portions each extending in the first direction from the first layer to the second layer, wherein
      the second layer is a cobalt/platinum artificial lattice layer, an alloy layer of cobalt and platinum, or an alloy layer of cobalt, platinum, and chromium.

2. The magnetic storage device according to claim 1, wherein the third layer has a thickness of more than 1 nm but less than or equal to 5 nm.

3. The magnetic storage device according to claim 1, wherein the second portions comprise at least one element selected from iron, cobalt, and nickel.

4. The magnetic storage device according to claim 3, wherein the second portions further comprise at least one element selected from a lanthanide, aluminum (Al), silicon (Si), gallium (Ga), magnesium (Mg), tantalum (Ta), molybdenum (Mo), tungsten (W), calcium (Ca), scandium (Sc), titanium (Ti), vanadium (V), chromium (Cr), manganese (Mn), zinc (Zn), yttrium (Y), zirconium (Zr), niobium (Nb), and hafnium (Hf).

5. The magnetic storage device according to claim 1, wherein the first portion is formed of an oxide, a nitride, a boride, a II-VI semiconductor, or a III-V semiconductor.

6. The magnetic storage device according to claim 5, wherein
the plurality of second portions comprise a magnetic metal,
the first portion is an oxide, a nitride, or a boride, and
an energy of formation of the oxide, nitride, or boride is less than an energy of formation of a corresponding oxide, nitride, or boride of the magnetic metal.

7. The magnetic storage device according to claim 1, wherein the first portion is formed of an oxide having a spinel structure or an oxide having a corundum structure.

8. The magnetic storage device according to claim 1, wherein the first layer comprises iron.

9. The magnetic storage device according to claim 8, wherein the first layer further comprises cobalt and boron.

10. The magnetic storage device according to claim 1, wherein perpendicular magnetic anisotropy of the second layer is higher than perpendicular magnetic anisotropy of the first layer.

11. The magnetic storage device according to claim 1, wherein the first layer is magnetically coupled to the second layer via the third layer.

12. The magnetic storage device according to claim 1, further comprising:
a switching element connected to the magnetoresistance effect element in series.

13. The magnetic storage device according to claim 1, wherein
the reference layer includes a plurality of cobalt-containing layers and a plurality of platinum-containing layers that are alternately stacked on each other.

14. The magnetic storage device according to claim 1, further comprising:
a cap layer on one of the storage or reference layers, and
an under layer on the other of the storage or reference layers.

15. The magnetic storage device according to claim 1, wherein a ratio of total area of the plurality of second portions to area of the third layer is within a range of 5% to 20%.

16. A magnetic memory storage device, comprising:
a plurality of first wirings extending along a first direction;
a plurality of second wirings extending along a second direction crossing the first direction; and
a plurality of memory cells extending along a third direction crossing the first and second directions between the first and second wirings, each of the memory cell including a magnetoresistance effect element that includes:
   a storage layer having a variable magnetization direction,
   a reference layer having a fixed magnetization direction, and
   a tunnel barrier layer between the storage and reference layers in the third direction, wherein
   the storage layer includes:
      a first layer that is magnetic and contacting the tunnel barrier layer,
      a second layer that is magnetic and farther from the tunnel barrier layer than is the first layer in the third direction, and
      a third layer between the first and second layers in the third direction and including a first portion that is an insulating material or a semiconductor material and a plurality of second portions that are conductive material and surrounded in a plane orthogonal to the third direction by the first portion, the plurality of second portions each extending in the third direction from the first layer to the second layer, and the third layer has a thickness of more than 1 nm but less than or equal to 5 nm, wherein the second layer is a cobalt/platinum artificial lattice layer, an alloy layer of cobalt platinum, or an alloy layer of cobalt, platinum, and chromium.

17. The magnetic memory storage device according to claim 16, wherein each of the memory cells further includes a switching element connected to the corresponding magnetoresistance effect element in series.

18. The magnetic memory storage device according to claim 17, wherein the switching element becomes conductive when a predetermined voltage is applied thereto through the corresponding first and second wirings.

19. The magnetic memory storage device according to claim 16, wherein the reference layer is a cobalt/platinum artificial lattice layer.

20. The magnetic memory storage device according to claim 16, wherein the reference layer is a cobalt-platinum alloy, an iron-platinum alloy, or an iron-cobalt-terbium alloy.

* * * * *